US010068966B2

(12) United States Patent
Mieno

(10) Patent No.: US 10,068,966 B2
(45) Date of Patent: Sep. 4, 2018

(54) SEMICONDUCTOR CHANNEL-STOP LAYER AND METHOD OF MANUFACTURING THE SAME

(71) Applicant: Semiconductor Manufacturing International (Shanghai) Corporation, Shanghai (CN)

(72) Inventor: Fumitake Mieno, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 128 days.

(21) Appl. No.: 14/683,518

(22) Filed: Apr. 10, 2015

(65) Prior Publication Data
US 2016/0035826 A1    Feb. 4, 2016

(30) Foreign Application Priority Data

Jul. 31, 2014    (CN) .......................... 2014 1 0371055

(51) Int. Cl.
| H01L 21/8234 | (2006.01) |
| H01L 29/417 | (2006.01) |
| H01L 29/06 | (2006.01) |
| H01L 29/78 | (2006.01) |
| H01L 29/66 | (2006.01) |
| H01L 29/165 | (2006.01) |
| H01L 27/092 | (2006.01) |
| H01L 21/8238 | (2006.01) |
| H01L 21/762 | (2006.01) |

(52) U.S. Cl.
CPC ........ H01L 29/0638 (2013.01); H01L 21/762 (2013.01); H01L 21/823431 (2013.01); H01L 21/823821 (2013.01); H01L 27/0924 (2013.01); H01L 29/0653 (2013.01); H01L 29/165 (2013.01); H01L 29/41791 (2013.01); H01L 29/66795 (2013.01); H01L 29/7851 (2013.01)

(58) Field of Classification Search
CPC ..... H01L 21/823431; H01L 21/823821; H01L 21/845; H01L 27/0924; H01L 29/41791; H01L 29/785
See application file for complete search history.

(56) References Cited

U.S. PATENT DOCUMENTS

| 2013/0313619 A1* | 11/2013 | Fumitake | .............. | H01L 21/845 257/288 |
| 2013/0341733 A1* | 12/2013 | Erickson | ......... | H01L 21/823431 257/401 |

(Continued)

FOREIGN PATENT DOCUMENTS

| CN | 103854981 A | 6/2014 |
| CN | 103855011 A | 6/2014 |

*Primary Examiner* — Phat X Cao
(74) *Attorney, Agent, or Firm* — Innovation Counsel LLP

(57) ABSTRACT

A method for manufacturing a semiconductor device may include forming a semiconductor portion, forming a doped portion, and forming a dielectric member. A side of the dielectric member abuts each of the semiconductor portion and the doped portion. A first half of the doped portion is positioned between the semiconductor portion and a second half of the doped portion. A dopant concentration of the second half of the doped portion is greater than a dopant concentration of the first half of the doped portion.

9 Claims, 13 Drawing Sheets

(56) References Cited

U.S. PATENT DOCUMENTS

2014/0103439 A1* 4/2014 Weis ................ H01L 29/66795
  257/365
2015/0380556 A1* 12/2015 Ching ................ H01L 29/7849
  257/351

* cited by examiner

S101 Forming a first semiconductor portion; forming a doped portion; and forming a dielectric member, wherein a side of the dielectric member abuts each of the first semiconductor portion and the doped portion, wherein the first semiconductor portion is formed of at least a first semiconductor material, wherein a first half of the doped portion is positioned between the first semiconductor portion and a second half of the doped portion, and wherein a dopant concentration of the second half of the doped portion is greater than a dopant concentration of the first half of the doped portion.

S102 Forming a second semiconductor portion on the doped portion, such that the doped portion is positioned between the first semiconductor portion and the second semiconductor portion.

FIG. 1

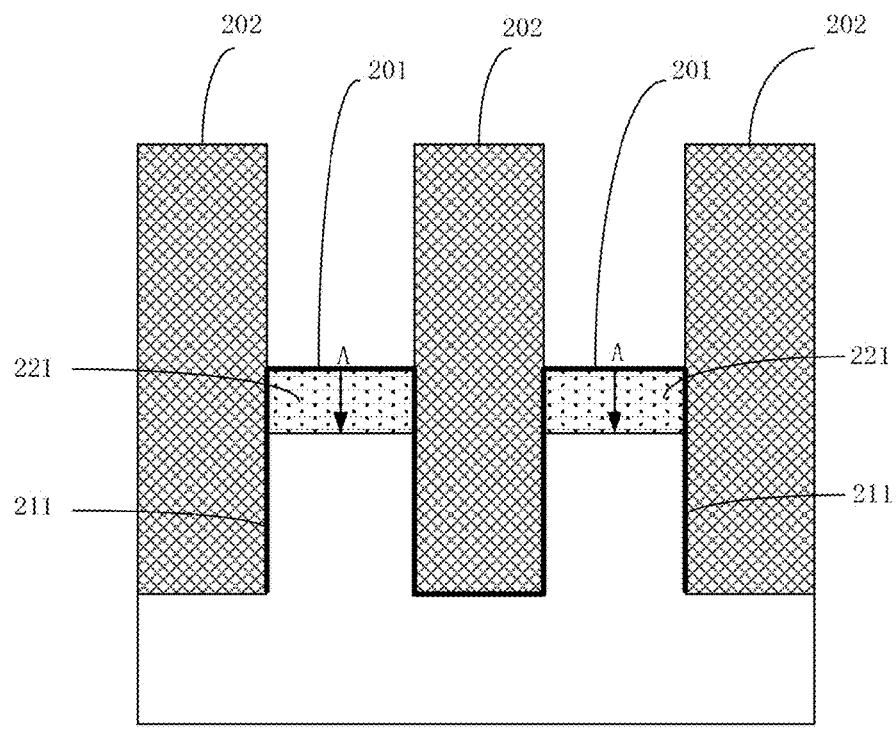

FIG. 2

SEMICONDUCTOR CHANNEL-STOP LAYER AND METHOD OF MANUFACTURING THE SAME

CROSS-REFERENCE TO RELATED APPLICATION

This application claims priority to and benefit of Chinese Patent Application No. 201410371055.3, filed on 31 Jul. 2014, the Chinese Patent Application being incorporated herein by reference in its entirety.

BACKGROUND OF THE INVENTION

The present invention is related to a semiconductor device and a method for manufacturing the semiconductor device.

A semiconductor device, such as a semiconductor substrate or a transistor, may include a doped portion, such as a channel-stop layer. The dopant distribution of the doped portion may significantly affect the performance of the semiconductor device. For example, a channel-stop layer of a fin field effect transistor (FinFET) may substantially affect the threshold voltage variation of the FinFET. In general, a channel-stop layer having a substantially concentrated dopant distribution may be desirable.

Nevertheless, in manufacturing of the semiconductor device, for forming one or more insulating members, such as one or more shallow trench isolation (STI) members, an annealing process may be performed at a substantially high temperature for a substantially long time duration. The long, high-temperature annealing process may cause the doped portion to have an undesirably wide dopant distribution.

SUMMARY

An embodiment of the present invention may be related to a method for manufacturing a semiconductor device. The method may include forming a first semiconductor portion, forming a doped portion, and forming a dielectric member. A side of the dielectric member may abut (and/or directly contact) each of the first semiconductor portion and the doped portion. The first semiconductor portion may be formed of at least a first semiconductor material, e.g., silicon (Si). A first half of the doped portion may be positioned between the first semiconductor portion and a second half of the doped portion. A dopant concentration of the second half of the doped portion may be greater than a dopant concentration of the first half of the doped portion. The aforementioned "a dopant concentration" may mean, for example, "the maximum dopant concentration" or "the average dopant concentration". The first half of the doped portion and the second half of the doped portion may respectively represent the lower half of the doped portion and the upper half of the doped portion in the process of manufacturing the semiconductor device.

The method may include forming a second semiconductor portion on the doped portion. The second semiconductor portion may be formed of at least one of the first semiconductor material and a second semiconductor material. The doped portion may be positioned between the first semiconductor portion and the second semiconductor portion. The second semiconductor material may be different from the first semiconductor material. For example, the second semiconductor material may include one or more of silicon-germanium (SiGe), silicon (Si), and germanium (Ge). The first semiconductor portion, the doped portion, and the second semiconductor portion may form a fin structure.

A process for forming the doped portion may include the following steps: forming a preliminary doped portion that may be positioned on the first semiconductor portion; and removing a portion of the preliminary doped portion to form the doped portion.

A first half (e.g., the lower half) of the preliminary doped portion may be positioned between the first semiconductor portion and a second half (e.g., the upper half) of the preliminary doped portion. A dopant concentration (e.g., the maximum or average dopant concentration) of the second half of the preliminary doped portion may be substantially equal to a dopant concentration (e.g., the maximum or average dopant concentration) of the first half of the preliminary doped portion.

The method may include removing at least one of a mask layer and a second semiconductor portion before or when removing the portion of the preliminary doped portion. The second semiconductor portion may be formed of the first semiconductor material.

The dielectric member may be formed after the preliminary doped portion has been formed. The portion of the preliminary doped portion may be removed after the dielectric member has been formed.

A process for forming the first semiconductor portion, the preliminary doped portion, and the dielectric member may include the following steps: providing a dopant set to a semiconductor member to form a doped region in the semiconductor member; removing a portion of the semiconductor member that includes a portion of the doped region to form the first semiconductor portion, the preliminary doped portion, and a cavity; and providing a dielectric material in the cavity for forming the dielectric member.

The doped portion may include at least a half of the preliminary doped portion.

A process for forming the doped portion may include the following steps: forming a first preliminary semiconductor portion, wherein the first preliminary semiconductor portion may be formed of the first semiconductor material; forming a second preliminary semiconductor portion on the first preliminary semiconductor portion, wherein the second preliminary semiconductor portion may be formed of a second semiconductor material different from the first semiconductor material; and providing a dopant set to at least the second preliminary semiconductor portion to form the doped portion.

The first semiconductor portion may include the first preliminary semiconductor portion and an undoped portion of the second preliminary semiconductor portion.

A portion of the dopant set may be provided to the first preliminary semiconductor portion. The doped portion may include a portion of the first preliminary semiconductor portion.

A process for forming the first preliminary semiconductor portion may include removing a portion of a semiconductor structure. The portion of the semiconductor structure may be removed after the dielectric member has been formed. The second preliminary semiconductor portion may abut the side of the dielectric member.

The method may include removing a portion of the dielectric member to form a reduced dielectric member after the doped portion has been formed. A top side of the reduced dielectric member may be positioned farther from a bottom side of the semiconductor device than a top side of the doped portion.

The method may include using the doped portion to form a channel-stop layer.

A top portion of the doped portion may be positioned farther from the first semiconductor portion and may have a higher dopant concentration than any other portions of the doped portion. The tope portion of the doped portion may have the maximum dopant concentration of the doped portion.

An embodiment of the present invention may be related to a semiconductor device. The semiconductor device may include a first semiconductor portion, a doped portion, and a dielectric member. A side of the dielectric member may abut each of the first semiconductor portion and the doped portion. The first semiconductor portion may be formed of a first semiconductor material. A first half of the doped portion may be positioned between the first semiconductor portion and a second half of the doped portion. A dopant concentration of the second half of the doped portion may be greater than a dopant concentration of the first half of the doped portion.

The semiconductor device may include a second semiconductor portion. The second semiconductor portion may be formed of at least one of the first semiconductor material and a second semiconductor material. The second semiconductor material may be different from the first semiconductor material. The doped portion may be positioned between the first semiconductor portion and the second semiconductor portion.

The semiconductor device may include a second semiconductor portion. The second semiconductor portion may be formed of a second semiconductor material different from the first semiconductor material. The second semiconductor portion may be positioned between the first semiconductor portion and the doped portion and may represent an undoped part of a preliminary semiconductor portion.

The doped portion may include a first doped semiconductor portion and a second doped semiconductor portion. The first doped semiconductor portion may be positioned between the first semiconductor portion and the second doped semiconductor portion. The first doped semiconductor portion may include the first semiconductor material and may represent a doped part of a preliminary semiconductor portion. The second doped semiconductor portion may include a second semiconductor material different from the first semiconductor material.

A top portion of the doped portion may be positioned farther from the first semiconductor portion and may have a higher dopant concentration than any other portions of the doped portion.

According to embodiments of the invention, a doped portion of a semiconductor device may have a substantially concentrated dopant distribution. Advantageously, the doped portion may facilitate optimization of the performance of the semiconductor device.

The above summary is related to some of many embodiments of the invention disclosed herein and is not intended to limit the scope of the invention.

BRIEF DESCRIPTION OF THE DRAWINGS

FIG. 1 shows a flowchart that illustrates steps in a method for manufacturing a semiconductor device in accordance with one or more embodiments of the present invention.

FIG. 2 shows a schematic cross-sectional view that illustrates elements of a semiconductor device in accordance with one or more embodiments of the present invention.

DETAILED DESCRIPTION

Figure 3A:
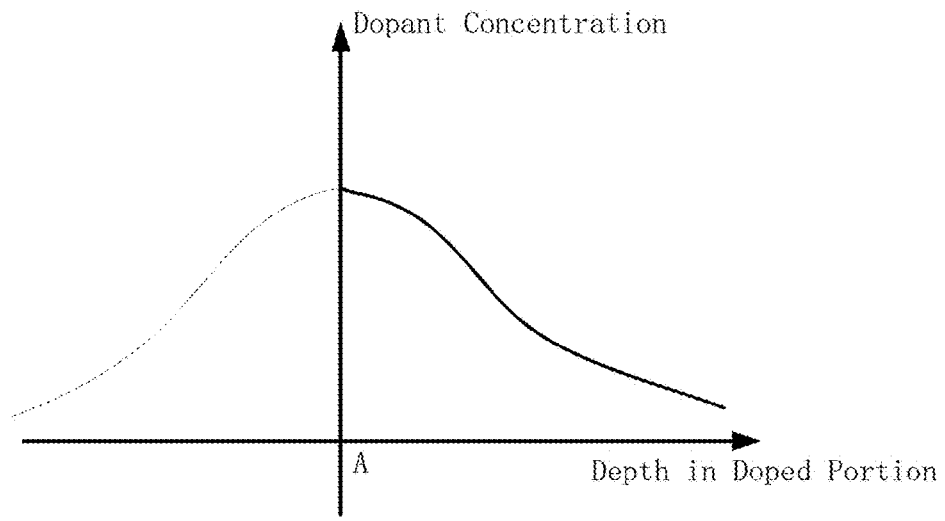
FIG. 3A shows a schematic diagram that illustrates a distribution of dopant concentration in a doped portion of a semiconductor device in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc.

may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 3B:
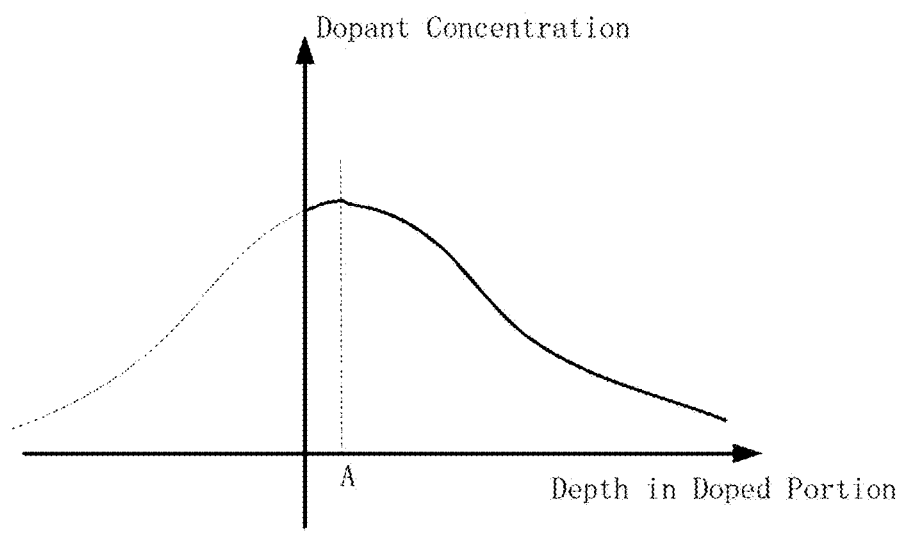
FIG. 3B shows a schematic diagram that illustrates a distribution of dopant concentration in a doped portion of a semiconductor device in accordance with one or more embodiments of the present invention.

FIG. 1 shows a flowchart that illustrates steps in a method for manufacturing a semiconductor device in accordance with one or more embodiments of the present invention. FIG. 2 shows a schematic cross-sectional view that illustrates elements of the semiconductor device in accordance with one or more embodiments of the present invention. FIG. 3A shows a schematic diagram that illustrates a distribution of dopant concentration in a doped portion of the semiconductor device in accordance with one or more embodiments of the present invention. FIG. 3B shows a schematic diagram that illustrates a distribution of dopant concentration in a doped portion of the semiconductor device in accordance with one or more embodiments of the present invention. For example, the semiconductor device may be a semiconductor substrate or a transistor (e.g., a FinFET).

Referring to FIG. 1, the method may include a step S101 and a step S102.

Referring to FIG. 1 and FIG. 2, the step S101 may include forming a first-type semiconductor portion 211 (or first semiconductor portion 211, for conciseness), forming a doped portion 221, and forming a dielectric member 202. The step S101 may include forming a plurality of fin structures 201 and a plurality of dielectric members 202. A fin structure 201 may include a first semiconductor portion 211 and a doped portion 221, which may be positioned on the first semiconductor portion 211. A dielectric member 202 neighboring the fin structure 201 may electrically insulate the fin structure 201 from other elements in the semiconductor device. A side of the dielectric member 202 may abut (and/or directly contact) each of the first semiconductor portion 211 and the doped portion 221.

The first semiconductor portion 211 may be formed of at least a first semiconductor material. For example, the first semiconductor material may include one or more of silicon (Si), germanium (Ge), and silicon-germanium (SiGe). The Ge concentration in the SiGe material may be in a range of 40 atom percent to 75 atom percent, such as 55 atom percent.

The doped portion 221 may be implanted with a dopant set that may include one or more dopant materials, such as one or more of phosphorus (p), arsenic (As), antimony (Sb), and boron (B). The dopant material(s) may be selected to configure the semiconductor device as a P-type metal-oxide-semiconductor field-effect transistor (PMOS) or an N-type metal-oxide-semiconductor field-effect transistor (NMOS).

Referring to FIG. 2, FIG. 3A, and FIG. 3B, the dopant concentration in the doped portion 221 may decrease from an upper part of the doped portion 221 to a lower part of the doped portion 221. The decrease direction may be represented by the arrows shown in FIG. 2.

A first half of the doped portion 221 may be positioned between the first semiconductor portion 211 and a second half of the doped portion 221. A dopant concentration of the second half of the doped portion 221 may be greater than a dopant concentration of the first half of the doped portion 221. The aforementioned "a dopant concentration" may mean, for example, "the maximum dopant concentration" or "the average dopant concentration". The first half of the doped portion 221 and the second half of the doped portion 221 may respectively represent the lower half of the doped portion 221 and the upper half of the doped portion 221 in the process of manufacturing the semiconductor device.

Referring to FIG. 3A, the solid line to the right of the vertical axis illustrates dopant distribution along a depth in the doped portion 221 in one or more embodiments. The symbol A may indicate a position with the maximum dopant concentration in the doped portion 221. A top portion (or top side) of the doped portion 221 (with substantially zero depth in the doped portion 221) may be positioned farther from the first semiconductor portion 211 and may have a higher dopant concentration than any other portions of the doped portion 221. The tope portion of the doped portion 221 may have the maximum dopant concentration of the doped portion 221.

Referring to FIG. 3B, the solid line to the right of the vertical axis illustrates dopant distribution along a depth in the doped portion 221 in one or more embodiments. The symbol A may indicate a position with the maximum dopant concentration in the doped portion 221. An upper part of the doped portion 221 (with a small depth in the doped portion 221) may be positioned farther from the first semiconductor portion 211 and may have a higher dopant concentration than a lower part of the doped portion 221. The upper part of the doped portion 221, which has a small depth with reference to the top side of the doped portion 221, may have the maximum dopant concentration of the doped portion 221.

As can be appreciated from FIG. 3A and FIG. 3B, the doped portion 221 may have a substantially concentrated (or narrow) dopant distribution, with most of the dopant concentrating in the upper half of the doped portion 221. Advantageously, the doped portion 221 may facilitate optimization of the performance of the semiconductor device.

Referring to FIG. 1, the step S102 may include forming a second-type semiconductor portion (or second semiconductor portion, for conciseness) on the doped portion 221, such that the doped portion 221 may be positioned between the first semiconductor portion 211 and the second semiconductor portion. The second semiconductor portion may be identical to or analogous to the second-type semiconductor portion 1401 (or second-type semiconductor portion 1401, for conciseness) illustrated in FIG. 16. The second semiconductor portion may be formed of at least one of the first semiconductor material and a second semiconductor material. The second semiconductor material may be different from the first semiconductor material. For example, the second semiconductor portion may be formed of one or more of silicon-germanium (SiGe), silicon (Si), and germanium (Ge). The Ge concentration in the SiGe material may be in a range of 40 atom percent to 75 atom percent, such as 55 atom percent. The second semiconductor portion may have a single-layer structure or a multi-layer structure. The first semiconductor portion 211, the doped portion 221, and the second semiconductor portion may form a fin structure, such as the fin structure 1403 illustrated in FIG. 16.

Figure 4:
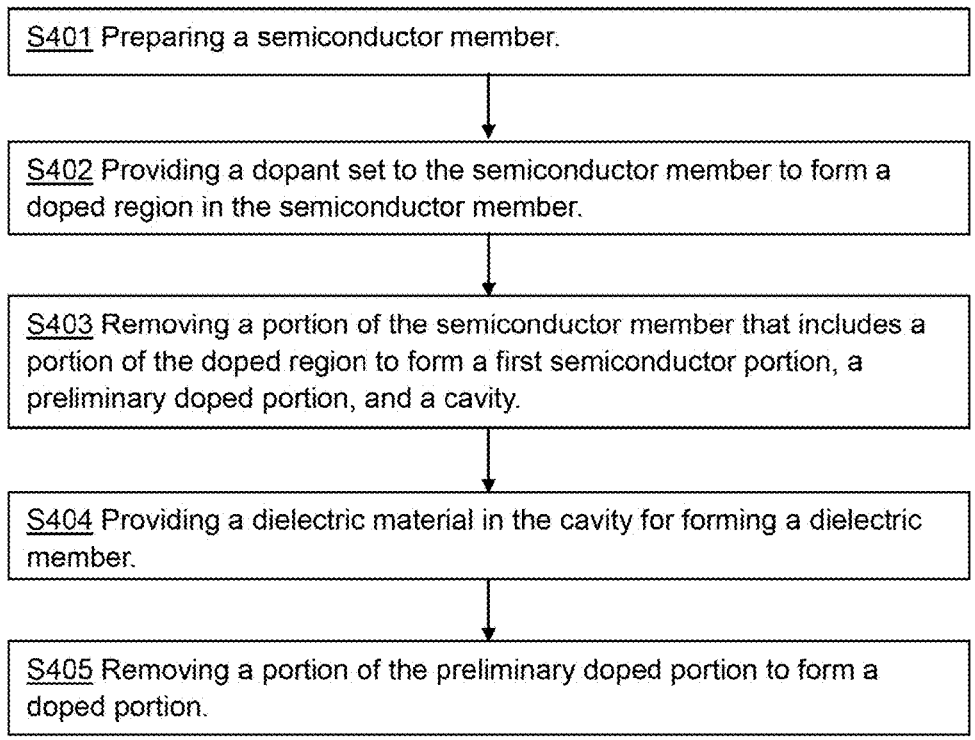
FIG. 4 shows a flowchart that illustrates steps in a method for manufacturing a semiconductor device in accordance with one or more embodiments of the present invention.

FIG. 4 shows a flowchart that illustrates steps in a method for manufacturing a semiconductor device (e.g., the semiconductor device discussed with reference to FIG. 1, FIG. 2, FIG. 3A, and FIG. 3B) in accordance with one or more embodiments of the present invention. FIG. 5, FIG. 6, FIG. 7, FIG. 8A, and FIG. 8B show schematic cross-sectional views that illustrate elements and/or structures formed in the method for manufacturing a semiconductor device in accordance with one or more embodiments of the present invention.

Referring to FIG. 4, the method may include a step S401, a step S402, a step S403, a step S404, and a step S405.

Figure 5:
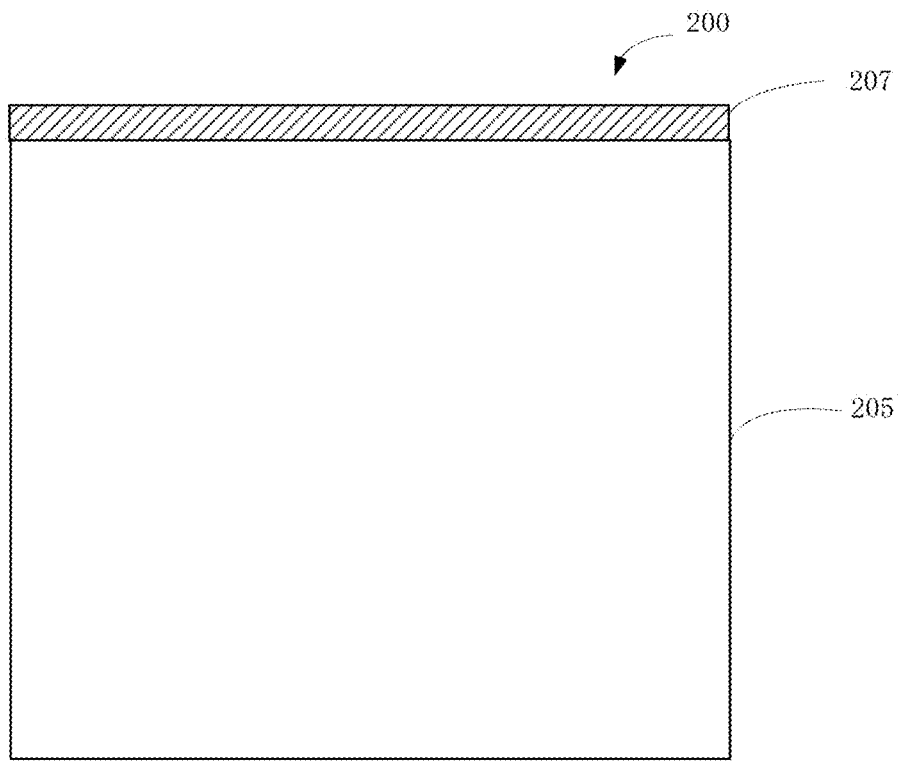
FIG. 5, FIG. 6, FIG. 7, FIG. 8A, and FIG. 8B show schematic cross-sectional views that illustrate elements and/or structures formed in a method for manufacturing a semiconductor device in accordance with one or more embodiments of the present invention.

Referring to FIG. 4 and FIG. 5, the step S401 may include preparing a semiconductor member 205. The step S401 may include preparing a preliminary structure 200 that may include the semiconductor member 205 and a mask material layer 207 (e.g., a hard mask material layer). The semiconductor member 205 may be formed of a first semiconductor material, which may include one or more of Si, Ge, and SiGe. The semiconductor member 205 may have a single-layer structure or a multi-layer structure. The mask material layer 207 may overlap (and contact) the semiconductor member 205. The mask material layer 207 may be formed of, for example, silicon nitride ($Si_xN_y$).

Figure 6:
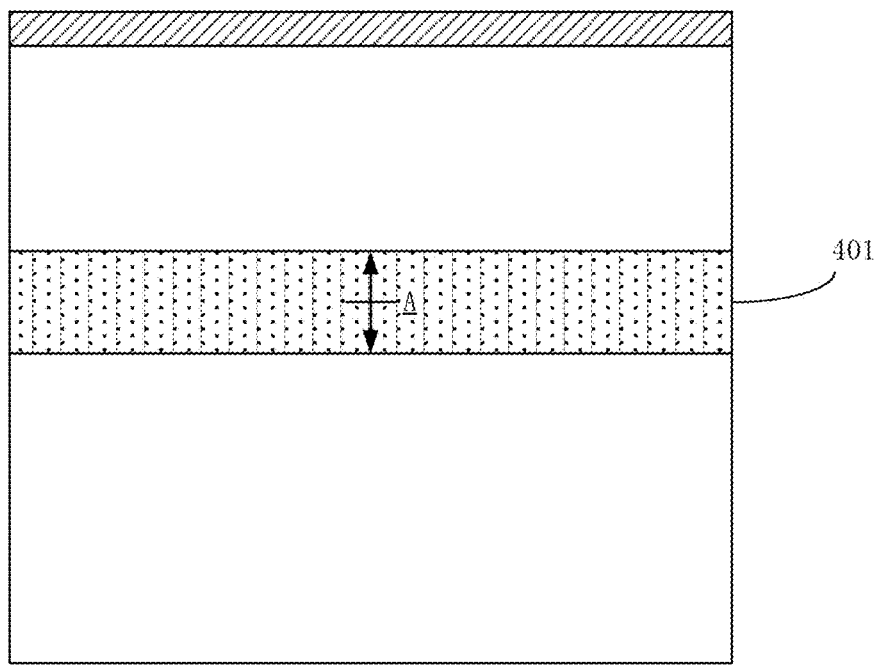

Referring to FIG. 4, FIG. 5, and FIG. 6, the step S402 may include providing a dopant set to the semiconductor member 205, e.g., using an ion implantation process, to form a doped region 401 in the semiconductor member 205. The dopant set may include one or more dopant materials, such as one or more of phosphorus (p), arsenic (As), antimony (Sb), and boron (B). The dopant material(s) may be selected to configure the semiconductor device as a P-type metal-oxide-semiconductor field-effect transistor (PMOS) or an N-type metal-oxide-semiconductor field-effect transistor (NMOS). The position of the doped region 401 in the semiconductor member 205 may be configured (e.g., through configuration of ion implantation energy) according to particular embodiments.

One or more other ion implantation processes may be performed on the semiconductor member 205. For example, for forming an N-well or a P-well, an ion implantation process may be performed prior to the formation of the doped region 401.

The maximum dopant concentration in the doped region 401 may be at the position A. The arrows shown in FIG. 6 may indicate dopant decrease directions associated with the doped region 401. Dopant concentration in the doped region 401 may decrease from the position A toward the top side of the doped region 401 and toward the bottom side of the doped region 401. In an embodiment, a dopant concentration (e.g., the maximum or average dopant concentration) of the upper half of the doped region 401 may be substantially equal to a dopant concentration (e.g., the maximum or average dopant concentration) of the lower half of the doped region 401. In an embodiment, the dopant distribution in the doped region 401 may be identical to or analogous to a combination of the dashed curve and the solid curve shown in FIG. 3A or FIG. 3B.

Figure 7:
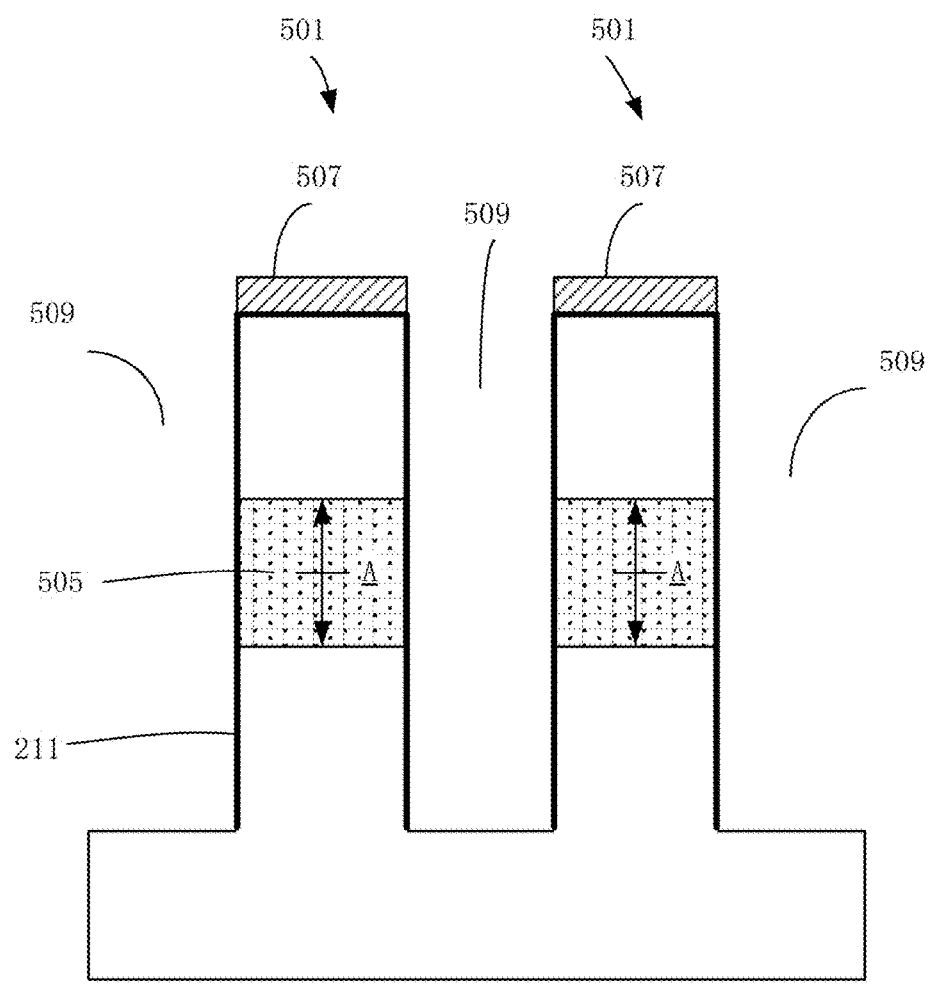

Referring to FIG. 4, FIG. 6, and FIG. 7, the step S403 may include removing a portion of the semiconductor member 205 that includes a portion of the doped region 401 to form the first semiconductor portion 211, a preliminary doped portion 505, and a cavity 509. The step S403 may include the following sub-steps: processing the mask material layer 207 (e.g., using a lithography process and/or an etching process) to form a mask layer 507 that has patterned holes; and processing the semiconductor member 205 through the patterned holes (e.g., using a lithography process and/or an etching process) to remove portions of the semiconductor member 205 that include portions of the doped region 401, such that a plurality of preliminary fin structures 501 and a plurality of cavities 509 may be formed. Each preliminary fin structure 501 may include a first semiconductor portion 211, a preliminary doped portion 505, and a portion of the mask layer 507.

The maximum dopant concentration in the preliminary doped portion 505 may be at the position A. The arrows shown in FIG. 6 may indicate dopant decrease directions associated with the preliminary doped portion 505. Dopant concentration in the preliminary doped portion 505 may decrease from the position A toward the top side of the preliminary doped portion 505 and toward the bottom side of the preliminary doped portion 505.

In an embodiment, A first half (e.g., the lower half) of the preliminary doped portion 505 may be positioned between the first semiconductor portion 211 and a second half (e.g., the upper half) of the preliminary doped portion 505. A dopant concentration (e.g., the maximum or average dopant concentration) of the second half of the preliminary doped portion 505 may be substantially equal to a dopant concentration (e.g., the maximum or average dopant concentration) of the first half of the preliminary doped portion 505.

Figure 8A:
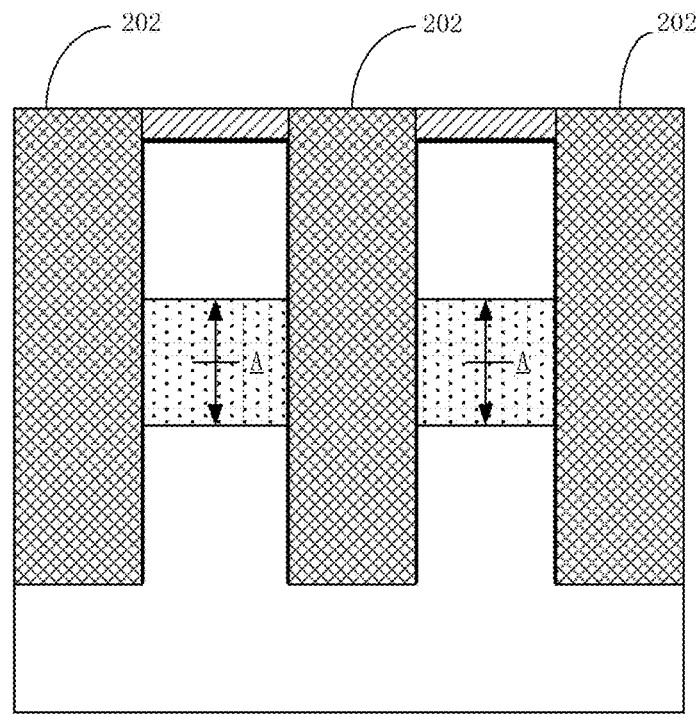

Referring to FIG. 4, FIG. 7, and FIG. 8A, the step S404 may include providing a dielectric material in the cavities 509 for forming dielectric members 202. For example, the dielectric material may be provided using a deposition process, such as a flowable chemical vapor deposition (FCVD) process.

An annealing process may be performed after the dielectric material has been provided in the cavities 509. The annealing process may be performed at about 1050 degrees Celsius for about 20 minutes. The annealing process may change dopant distribution in the preliminary doped portion 505.

A planarization process, such as a chemical-mechanical polishing (CMP) process, may be performed to planarize the top surfaces of the dielectric members 202 and the preliminary fin structures 501.

In an embodiment, after the annealing process, after the planarization process, and/or after the formation of the dielectric member 202, the dopant distribution in the preliminary doped portion 505 may be identical to or analogous to a combination of the dashed curve and the solid curve shown in FIG. 3A or FIG. 3B.

Figure 8B:
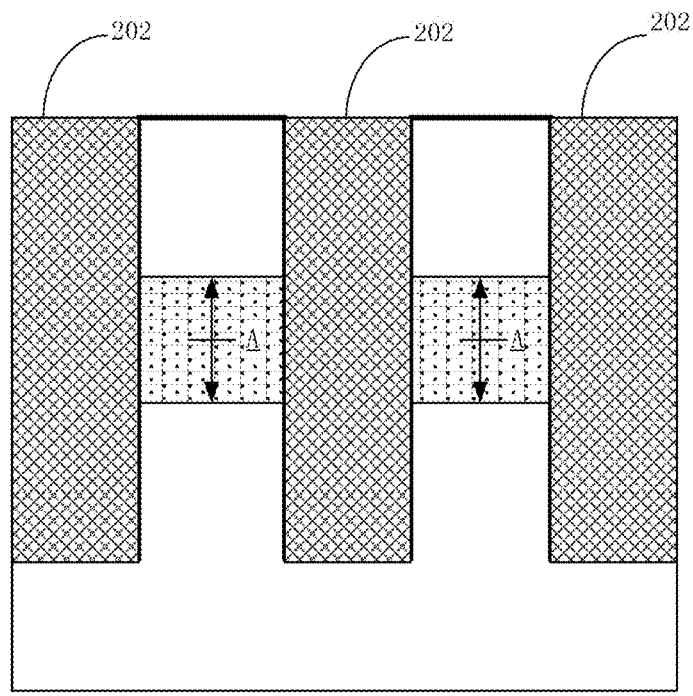

Referring go FIG. 8B, the planarization process and/or another process may remove the mask layer 507.

In an embodiment, the manufacturing of the semiconductor device may not need the mask layer 507.

Referring to FIG. 4, FIG. 8A or 8B, and FIG. 2, the step S405 may include removing portions of preliminary doped portions 505 to form doped portions 221. An etching process may be performed for removing the portions of the preliminary doped portions 505.

The step S405 may include removing at least one of the mask layer 507 and top semiconductor portions (i.e., portions of the preliminary fin structures 501 that are positioned on the preliminary doped portions 505) before or when removing the portions of the preliminary doped portions 505. Analogous to the first semiconductor portions 211, the top semiconductor portions may be formed of the first semiconductor material.

According to the steps S403, S404, and S405, the dielectric members 202 may be formed after the preliminary doped portions 505 have been formed, and the portions of the preliminary doped portions 505 may be removed after the dielectric members 202 have been formed.

A doped portion 221 may represent a remaining portion of a corresponding preliminary doped portion 505. The doped portion 221 may include a half of the preliminary doped portion 505, and the dopant concentration in the doped portion 221 may be represented by the solid curve shown in FIG. 3A. The doped portion 221 may include more than a half of the preliminary doped portion 505, and the dopant concentration in the doped portion 221 may be represented by the solid curve shown in FIG. 3B.

The method may include forming a channel-stop layer using the resulted doped portion 221.

The doped portion 221 and associated semiconductor device may have features and advantages discussed above with reference to FIG. 1, FIG. 2, FIG. 3A, and FIG. 3B.

Figure 9:
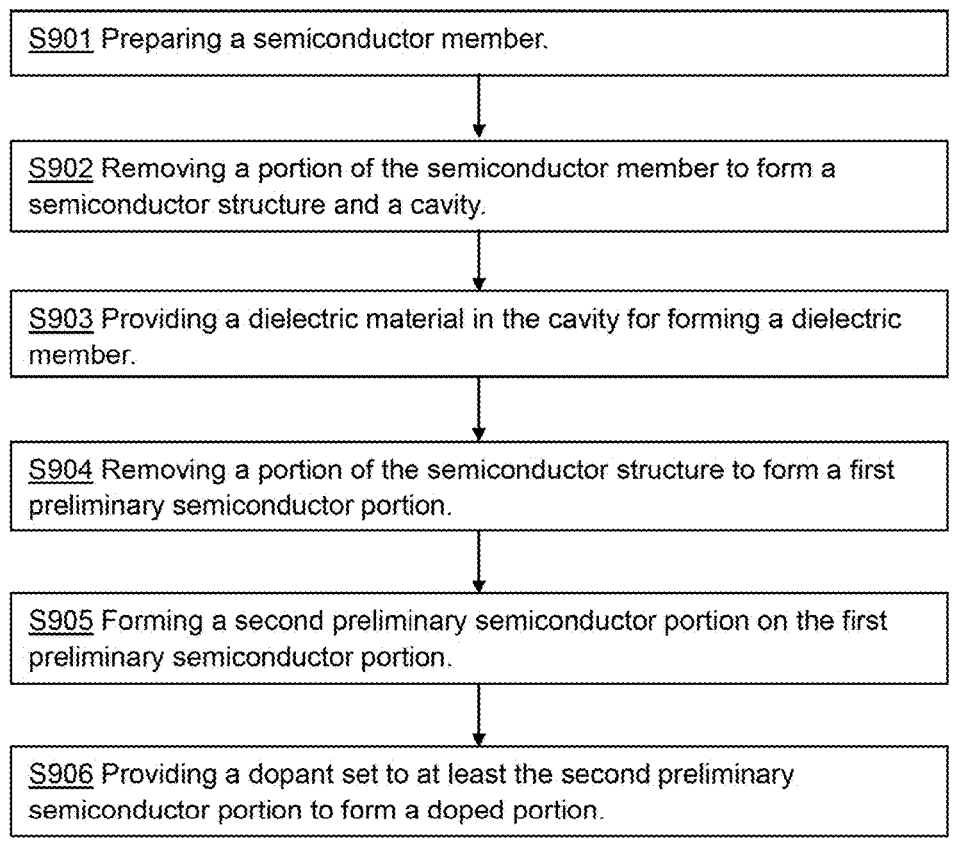
FIG. 9 shows a flowchart that illustrates steps in a method for manufacturing a semiconductor device in accordance with one or more embodiments of the present invention.

FIG. 9 shows a flowchart that illustrates steps in a method for manufacturing a semiconductor device (e.g., the semiconductor device discussed with reference to FIG. 1, FIG. 2, FIG. 3A, and FIG. 3B) in accordance with one or more embodiments of the present invention. FIG. 10, FIG. 11, FIG. 12, FIG. 13, FIG. 14, FIG. 15, FIG. 16, and FIG. 17 show schematic cross-sectional views that illustrate elements and/or structures formed in a method for manufacturing the semiconductor device in accordance with one or more embodiments of the present invention.

Referring to FIG. 9, the method may include a step S901, a step S902, a step S903, a step S904, a step S905, and a step S906.

Figure 10:
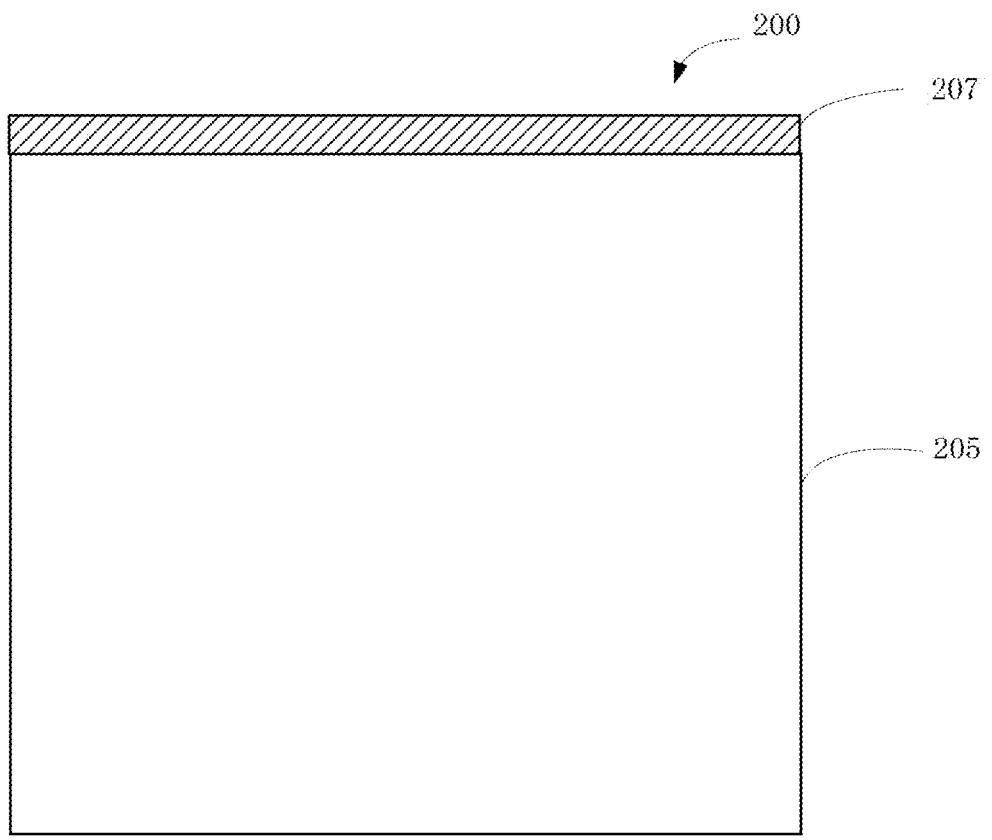
FIG. 10, FIG. 11, FIG. 12, FIG. 13, FIG. 14, FIG. 15, FIG. 16, FIG. 17, show schematic cross-sectional views that illustrate elements and/or structures formed in a method for manufacturing a semiconductor device in accordance with one or more embodiments of the present invention.

Referring to FIG. 9 and FIG. 10, the step S901 may include preparing a semiconductor member 205. The step S901 may include preparing a preliminary structure 200 that may include the semiconductor member 205 and a mask material layer 207 (e.g., a hard mask material layer). The semiconductor member 205 may be formed of a first semiconductor material, which may include one or more of Si, Ge, and SiGe. The semiconductor member 205 may have a single-layer structure or a multi-layer structure. The mask material layer 207 may overlap (and contact) the semiconductor member 205. The mask material layer 207 may be formed of, for example, silicon nitride ($Si_xN_y$).

Figure 11:
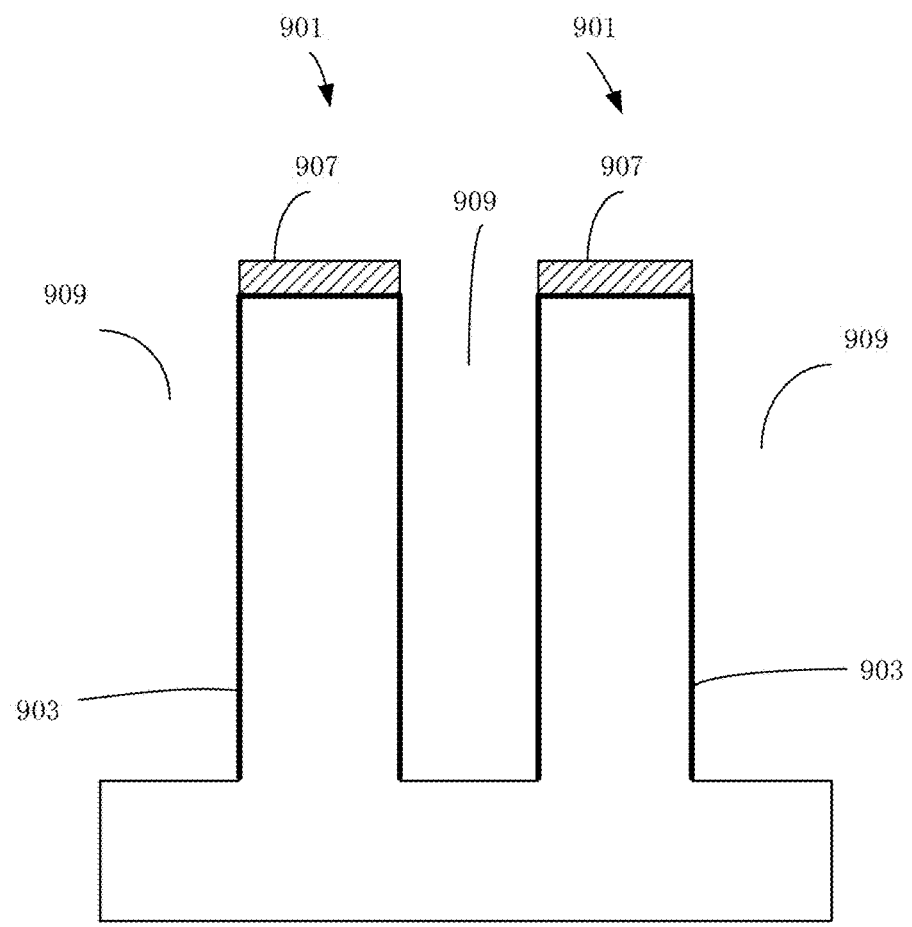

Referring to FIG. 9, FIG. 10, and FIG. 11, the step S902 may include removing a portion of the semiconductor member 205 to form a semiconductor structure and a cavity 909. The step S403 may include the following sub-steps: processing the mask material layer 207 (e.g., using a lithography process and/or an etching process) to form a mask layer 907 that has patterned holes; and processing the semiconductor member 205 through the patterned holes (e.g., using a lithography process and/or an etching process) to remove portions of the semiconductor member 205, such that a plurality of preliminary fin structures 901 and a plurality of cavities 909 may be formed. Each preliminary fin structure 901 may include a first preliminary fin portion 903 and a portion of the mask layer 907.

Figure 12:
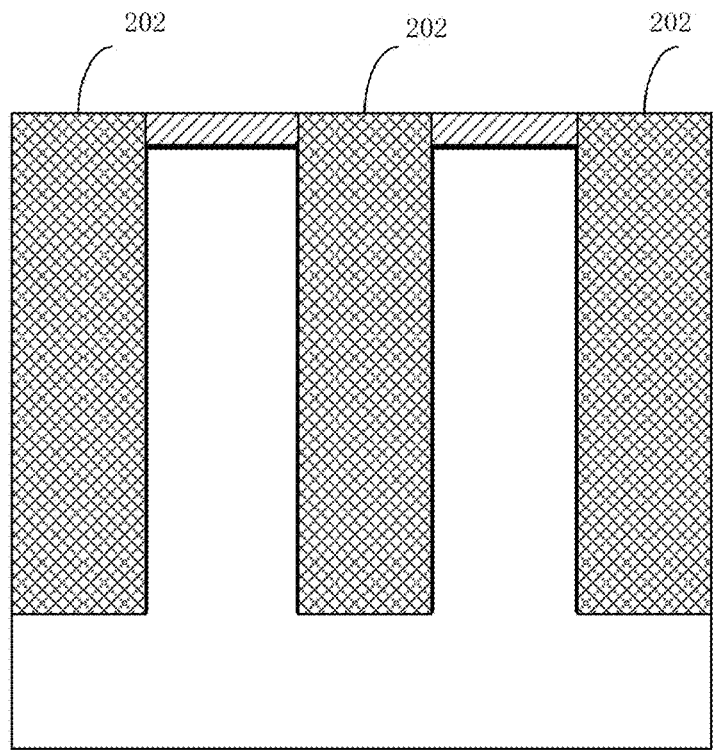

Referring to FIG. 9, FIG. 11, and FIG. 12, the step S903 may include providing a dielectric material in the cavities 909 for forming dielectric members 202. For example, the dielectric material may be provided using a deposition process, such as a flowable chemical vapor deposition (FCVD) process.

An annealing process may be performed after the dielectric material has been provided in the cavities 909. The annealing process may be performed at about 1050 degrees Celsius for about 20 minutes.

A planarization process, such as a chemical-mechanical polishing (CMP) process, may be performed to planarize the top surfaces of the dielectric members 202 and the preliminary fin structures 901. The planarization process and/or another process may remove the mask layer 907.

In an embodiment, the manufacturing of the semiconductor device may not need the mask layer 907.

Figure 13:
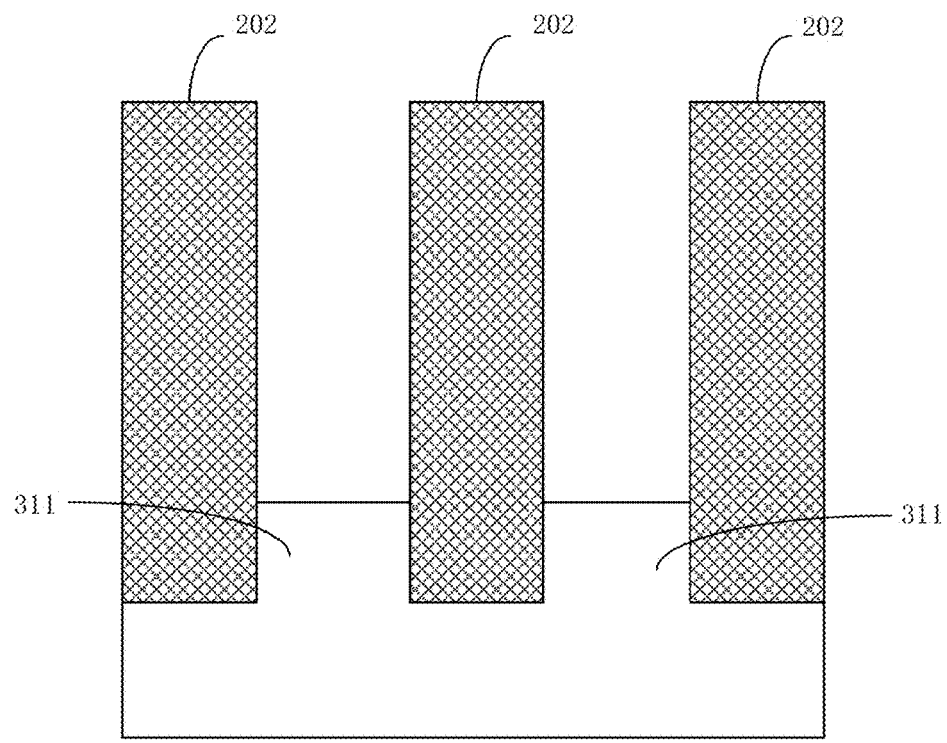

Referring to FIG. 9, FIG. 12, and FIG. 13, the step S904 may include removing portions of the semiconductor structure (i.e., removing portions of the first preliminary fin portions 903) to form first-type preliminary semiconductor portion 311 (or first preliminary semiconductor portions 311, for conciseness). An etching process may be performed for removing the portions of the first preliminary fin portions 903.

The step S405 may include removing the mask layer 907 before or when removing the portions of the first preliminary fin portions 903.

According to the steps S903 and S904, the portions of the semiconductor structure may be removed after dielectric members 202 have been formed.

Figure 14:
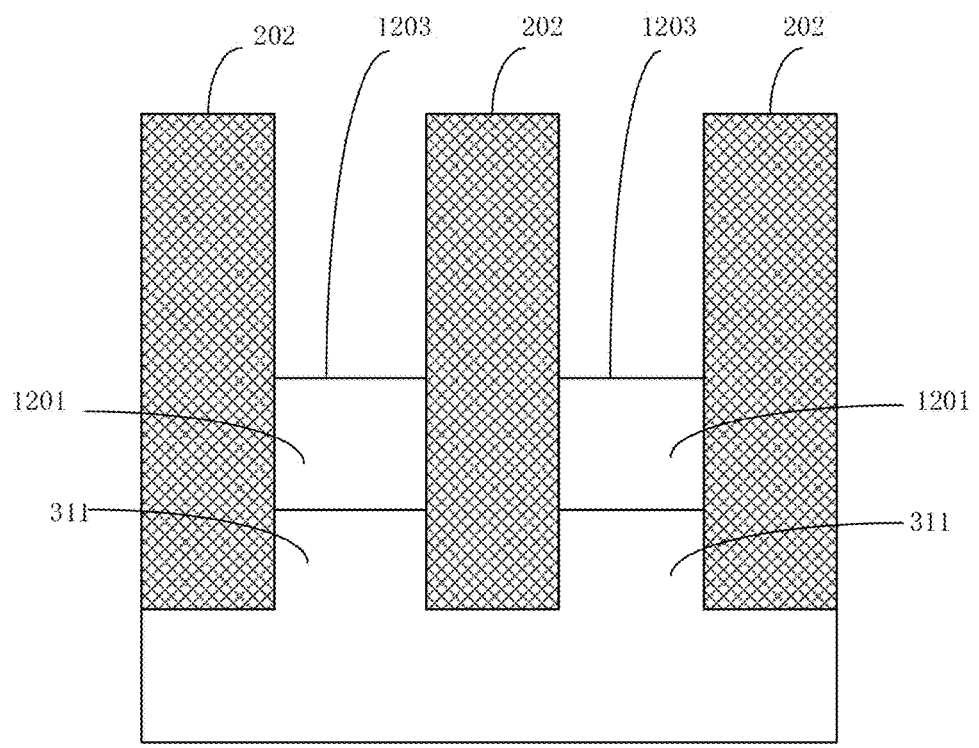

Referring to FIG. 9, FIG. 13, and FIG. 14, the step S905 may include forming second-type preliminary semiconductor portions 1201 (or second preliminary semiconductor portions 1201, for conciseness) on the first preliminary semiconductor portions 311. An epitaxial growth process and/or a selective deposition process may be used for forming the second-type preliminary semiconductor portions 1201. Each second-type preliminary semiconductor portion 1201 may abut one or more dielectric members 202. A first preliminary semiconductor portion 311 and a second preliminary semiconductor portion 1201 formed thereon may form a preparatory fin structure 1203.

Referring to FIG. 9, FIG. 14, FIG. 15, and FIG. 16, the step S906 may include providing (e.g., through ion implantation) a dopant set to at least the second preliminary semiconductor portions 1201 to form doped portions 221 and first semiconductor portions 211. Since the doped portions 221 are formed after the annealing process has been performed in the step S903, dopant distributions in the doped portions 221 may not be significantly affected by the annealing process and may be substantially concentrated. The doped portions 221, first semiconductor portions 211, and the associated semiconductor device may have features and advantages discussed with reference to FIG. 1, FIG. 2, FIG. 3A, and FIG. 3B.

In an embodiment, a first semiconductor portion 211 may include a first preliminary semiconductor portion 311 and an undoped portion (e.g., a lower part) of a corresponding second preliminary semiconductor portion 1201.

In an embodiment, a doped second preliminary semiconductor portion 1201 may function as a doped portion 221, and the corresponding first preliminary semiconductor portion 311 may function as the corresponding first semiconductor portion 211.

In an embodiment, a portion of the dopant set may be provided to a first preliminary semiconductor portion 311. A doped portion 221 may include a portion (e.g., an upper, doped part) of the first preliminary semiconductor portion 311.

Figure 15:
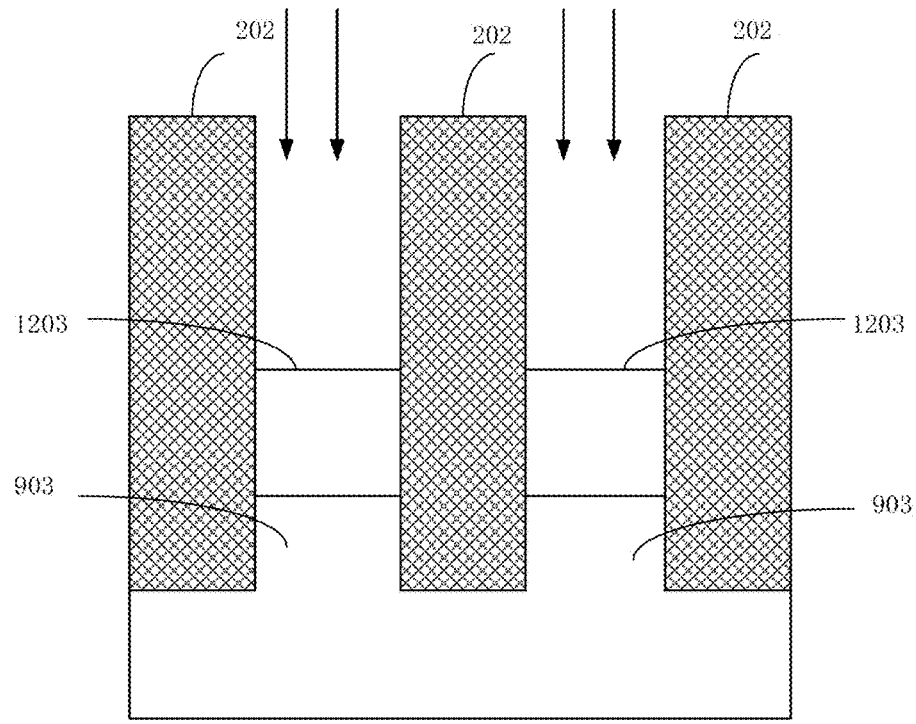
Figure 16:
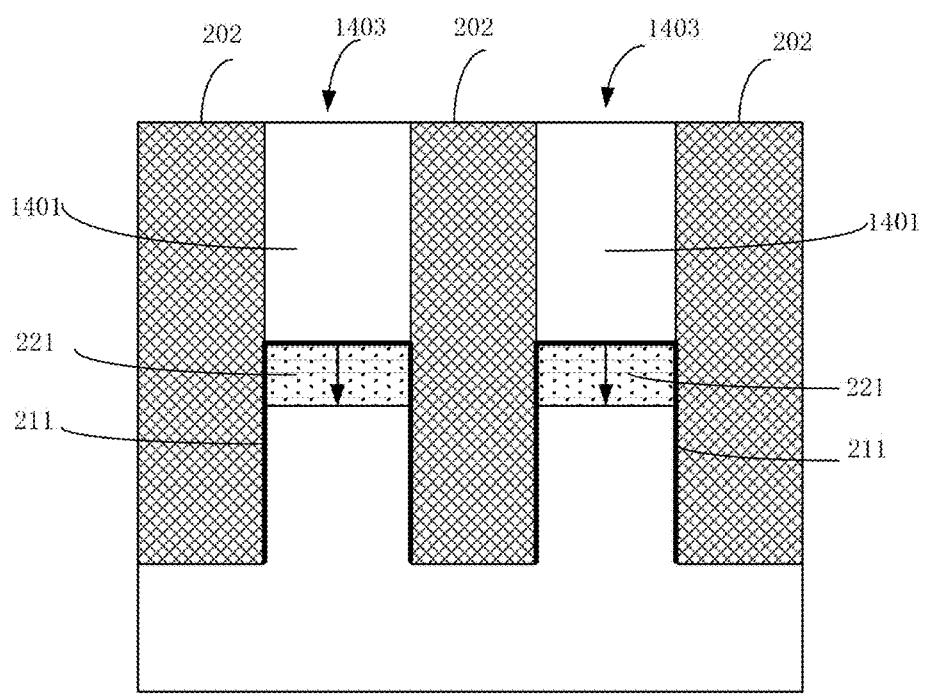

Referring to FIG. 1, FIG. 15, and FIG. 16, subsequent to the step 405 or the step S906, the step S102 may be performed to form second-type semiconductor portions 1401 (or second semiconductor portions 1401) or the doped portions 221. An epitaxial growth process and/or a selective deposition process may be used for forming the second semiconductor portions 1401.

A doped portion 221 may be positioned between a first semiconductor portion 211 and a second semiconductor portion 1401. A first semiconductor portion 211, a doped portion 221, and a second semiconductor portion 1401 may form a fin structure 1403 of the semiconductor device.

In an embodiment, a first semiconductor portion 211 may be formed of SiGe, and a second semiconductor portion 1401 may be formed of Ge.

In an embodiment, a first semiconductor portion 211 may include a Si layer and SiGe positioned on the Si layer, and a second semiconductor portion 1401 may be formed of Ge.

In an embodiment, a first semiconductor portion 211 may be formed of Si, and a second semiconductor portion 1401 may be formed of Si.

In an embodiment, a first semiconductor portion 211 may be formed of Si, and a second semiconductor portion 1401 may be formed of SiGe.

In an embodiment, a first semiconductor portion 211 may be formed of Ge, and a second semiconductor portion 1401 may be formed of Ge.

In an embodiment, a first semiconductor portion 211 may be formed of SiGe, and a second semiconductor portion 1401 may be formed of Ge.

Figure 17:
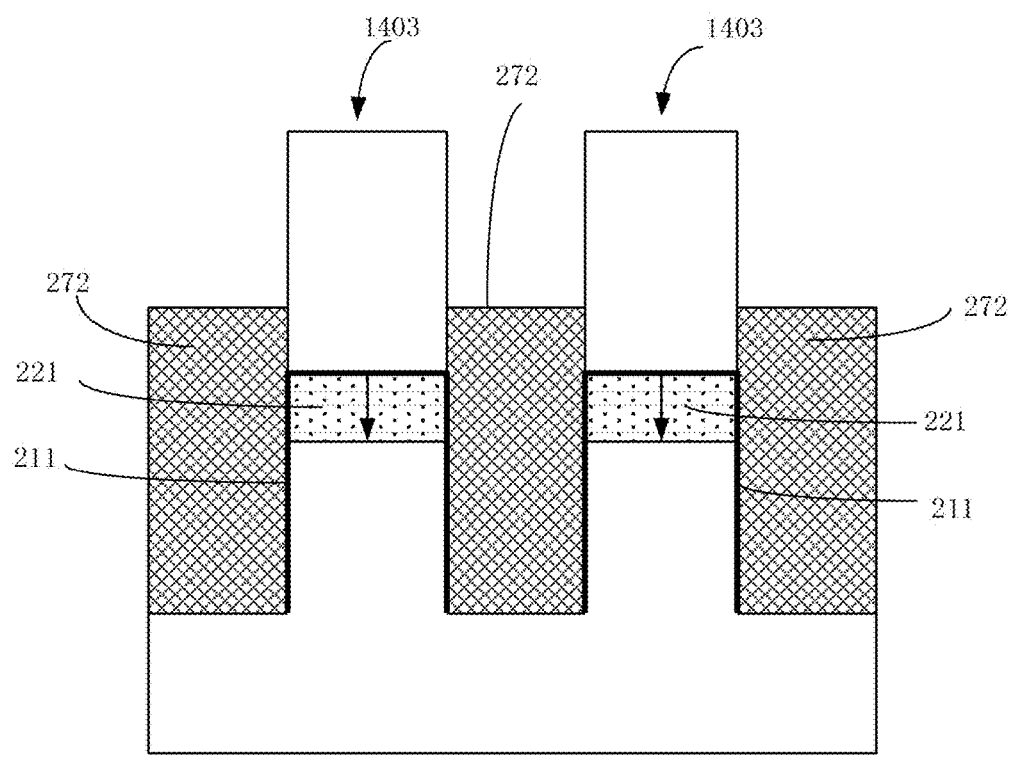

Referring to FIG. 17, the method may include removing portions of the dielectric members 202 to form reduced dielectric members 272 after the doped portions 221 have been formed and/or after the second semiconductor portions 1401 have been formed. A top side of a reduced dielectric member 272 may be higher (i.e., positioned farther from a bottom side of the semiconductor device) than a top side of a doped portion 221.

The method may include using the doped portion 221 to form a channel-stop layer of the semiconductor device.

An embodiment of the present invention may be related to a semiconductor device. The semiconductor device may have one or more of the features and advantages discussed with reference to FIGS. 1 to 17.

According to embodiments of the invention, a doped portion of a semiconductor device may have a substantially concentrated (or narrow) dopant distribution. Advantageously, the doped portion may facilitate optimization of the performance of the semiconductor device.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a semiconductor device, the method comprising:
    forming a first semiconductor portion;
    forming a preliminary doped portion that is positioned on the first semiconductor portion, wherein a first half of the preliminary doped portion is positioned between the first semiconductor portion and a second half of the preliminary doped portion, and wherein a dopant concentration of the second half of the preliminary doped portion is substantially equal to a dopant concentration of the first half of the preliminary doped portion;
    removing a top portion of the preliminary doped portion while retaining a bottom portion of the preliminary doped portion to form a doped portion, wherein both the top portion of the preliminary doped portion and the doped portion have a same width; and
    forming a dielectric member,
    wherein a side of the dielectric member abuts each of the first semiconductor portion and the doped portion,
    wherein the first semiconductor portion is formed of at least a first semiconductor material, wherein a first half of the doped portion is positioned between the first semiconductor portion and a second half of the doped portion, and wherein a dopant concentration of the second half of the doped portion is greater than a dopant concentration of the first half of the doped portion.

2. The method of claim 1, wherein the dielectric member is formed after the preliminary doped portion has been formed, and wherein the portion of the preliminary doped portion is removed after the dielectric member has been formed.

3. The method of claim 1, wherein a process for forming the first semiconductor portion, the preliminary doped portion, and the dielectric member comprises:

providing a dopant set to a semiconductor member to form a doped region in the semiconductor member;

removing a portion of the semiconductor member that includes a portion of the doped region to form the first semiconductor portion, the preliminary doped portion, and a cavity; and providing a dielectric material in the cavity for forming the dielectric member.

4. The method of claim 1, wherein the doped portion includes at least a half of the preliminary doped portion.

5. The method of claim 1, further comprising: removing a portion of the dielectric member to form a reduced dielectric member after the doped portion has been formed, wherein a top side of the reduced dielectric member is positioned farther from a bottom side of the semiconductor device than a top side of the doped portion.

6. The method of claim 1, further comprising: using the doped portion to form a channel-stop layer.

7. The method of claim 1, wherein a top portion of the doped portion is positioned farther from the first semiconductor portion and has a higher dopant concentration than any other portions of the doped portion.

8. A method for manufacturing a semiconductor device, the method comprising:

forming a first semiconductor portion;

forming a preliminary doped portion that is positioned on the first semiconductor portion;

removing a top portion of the preliminary doped portion while retaining a bottom portion of the preliminary doped portion to form a doped portion, wherein both the top portion of the preliminary doped portion and the doped portion have a same width;

forming a second semiconductor portion on the doped portion, such that the doped portion is positioned between the first semiconductor portion and the second semiconductor portion, wherein the second semiconductor portion is formed of at least one of a first semiconductor material and a second semiconductor material different from the first semiconductor material, and wherein the first semiconductor portion, the doped portion, and the second semiconductor portion form a fin structure; and forming a dielectric member, wherein a side of the dielectric member abuts each of the first semiconductor portion and the doped portion, wherein the first semiconductor portion is formed of at least the first semiconductor material, wherein a first half of the doped portion is positioned between the first semiconductor portion and a second half of the doped portion, and wherein a dopant concentration of the second half of the doped portion is greater than a dopant concentration of the first half of the doped portion.

9. A method for manufacturing a semiconductor device, the method comprising:

forming a first semiconductor portion;

forming a preliminary doped portion that is positioned on the first semiconductor portion;

removing a top portion of the preliminary doped portion while retaining a bottom portion of the preliminary doped portion to form a doped portion, wherein both the top portion of the preliminary doped portion and the doped portion have a same width;

removing at least one of a top semiconductor portion on the preliminary doped portion and a mask layer on the top semiconductor portion before or when removing the portion of the preliminary doped portion, wherein the top semiconductor portion is formed of a first semiconductor material; and forming a dielectric member, wherein a side of the dielectric member abuts each of the first semiconductor portion and the doped portion, wherein the first semiconductor portion is formed of at least the first semiconductor material, wherein a first half of the doped portion is positioned between the first semiconductor portion and a second half of the doped portion, and wherein a dopant concentration of the second half of the doped portion is greater than a dopant concentration of the first half of the doped portion.

* * * * *